United States Patent
Sakamaki

(10) Patent No.: US 11,777,069 B2
(45) Date of Patent: Oct. 3, 2023

(54) LIGHT-EMITTING MODULE

(71) Applicant: NICHIA CORPORATION, Anan (JP)

(72) Inventor: So Sakamaki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/048,404

(22) Filed: Oct. 20, 2022

(65) Prior Publication Data

US 2023/0066932 A1   Mar. 2, 2023

Related U.S. Application Data

(63) Continuation of application No. 17/161,402, filed on Jan. 28, 2021, now Pat. No. 11,508,891.

(30) Foreign Application Priority Data

Jan. 31, 2020   (JP) .................................. 2020-015089
Jan. 20, 2021   (JP) .................................. 2021-006953

(51) Int. Cl.
*H01L 33/62*   (2010.01)
*H01L 33/50*   (2010.01)

(52) U.S. Cl.
CPC ............ *H01L 33/62* (2013.01); *H01L 33/502* (2013.01)

(58) Field of Classification Search
CPC ....... H01L 33/62; H01L 33/502; H01L 33/44; H01L 33/50; H01L 33/56; H01L 2933/0025; H01L 2933/0066; H01L 25/0753; H01L 2933/0041; H01L 2933/0091

See application file for complete search history.

(56) References Cited

U.S. PATENT DOCUMENTS

| | | | | |
|---|---|---|---|---|
| 8,299,477 B2 * | 10/2012 | Kim | ..................... | H01L 27/156 257/91 |
| 2013/0306997 A1 * | 11/2013 | Lim | .................... | H01L 25/0753 438/34 |
| 2015/0146426 A1 * | 5/2015 | Yeh | ....................... | H01L 27/156 362/249.06 |

FOREIGN PATENT DOCUMENTS

JP         2002329896 A      11/2002

* cited by examiner

*Primary Examiner* — Jonathan Han
(74) *Attorney, Agent, or Firm* — Global IP Counselors, LLP

(57) ABSTRACT

A light emitting module includes a board, light sources, first and second wirings, and an insulating member. Each of the light sources includes first and second electrodes exposed from an upper side. The first wiring includes first extending portions and first connecting portions. The second wiring includes second extending portions and second connecting portions. The insulating member covers the first wiring and the second extending portions of the second wiring while a portion of each of the second extending portions of the second wiring is exposed from the insulating member through a corresponding one of the openings. The second connecting portions of the second wiring are arranged on or above a part of the insulating member positioned on or above the first connecting portions of the first wiring. The second connecting portions of the second wiring are respectively connected to the second extending portions at the openings.

8 Claims, 15 Drawing Sheets

LIGHT-EMITTING MODULE

CROSS-REFERENCE TO RELATED APPLICATION

This application is a continuation application of U.S. patent application Ser. No. 17/161,402, filed on Jan. 28, 2021. This application claims priority to Japanese Patent Application No. 2020-015089, filed on Jan. 31, 2020 and Japanese Patent Application No. 2021-006953, filed on Jan. 20, 2021. The entire disclosures of U.S. patent application Ser. No. 17/161,402, Japanese Patent Application Nos. 2020-015089 and 2021-006953 are hereby incorporated herein by reference.

BACKGROUND

The present disclosure relates to a light-emitting module.

Light-emitting devices including light-emitting elements such as light-emitting diodes are widely used for backlights for liquid-crystal displays or various light sources for displays or the like. As such a light-emitting device, a structure in which a light-emitting element is placed on a substrate provided with wiring has been proposed. For example, Japanese Patent Application Publication No. 2002-329896 discloses a light-emitting device in which electrodes on the lower surface of a light-emitting element are connected to wiring on the upper surface of a substrate.

SUMMARY

Further size reduction of light-emitting devices has been demanded in recent years. In order to reduce the size of a light-emitting device, a light-emitting element and wiring are required to be precisely arranged.

The present disclosure may provide a light-emitting module for which size reduction is possible.

A light emitting module according to an embodiment includes a board, a plurality of light sources, a first wiring, a second wiring, and an insulating member. The light sources are arranged on a main surface of the board along a first direction and a second direction different from the first direction. Each of the light sources includes a first electrode and a second electrode exposed from an upper side of a corresponding one of the light sources. The first wiring includes a plurality of first extending portions each extending from the first electrode of a corresponding one of the light sources and extending at least partially in the second direction, and a plurality of first connecting portions each extending in the first direction and electrically connecting two or more of the first extending portions. The second wiring includes a plurality of second extending portions each extending from the second electrode of a corresponding one of the light sources and extending at least partially in the first direction, and a plurality of second connecting portions each extending in the second direction and electrically connecting two or more of the second extending portions. The insulating member covers the first extending portions and the first connecting portions of the first wiring and the second extending portions of the second wiring. The insulating member defines a plurality of openings so that a portion of each of the second extending portions of the second wiring is exposed from the insulating member through a corresponding one of the openings. The second connecting portions of the second wiring are arranged on or above a part of the insulating member positioned on or above the first connecting portions of the first wiring. The second connecting portions of the second wiring are respectively connected to the second extending portions at the openings.

According to a light-emitting module of an embodiment of the present disclosure, a light-emitting module for which size reduction is possible can be provided.

DETAILED DESCRIPTION

Figure 1:
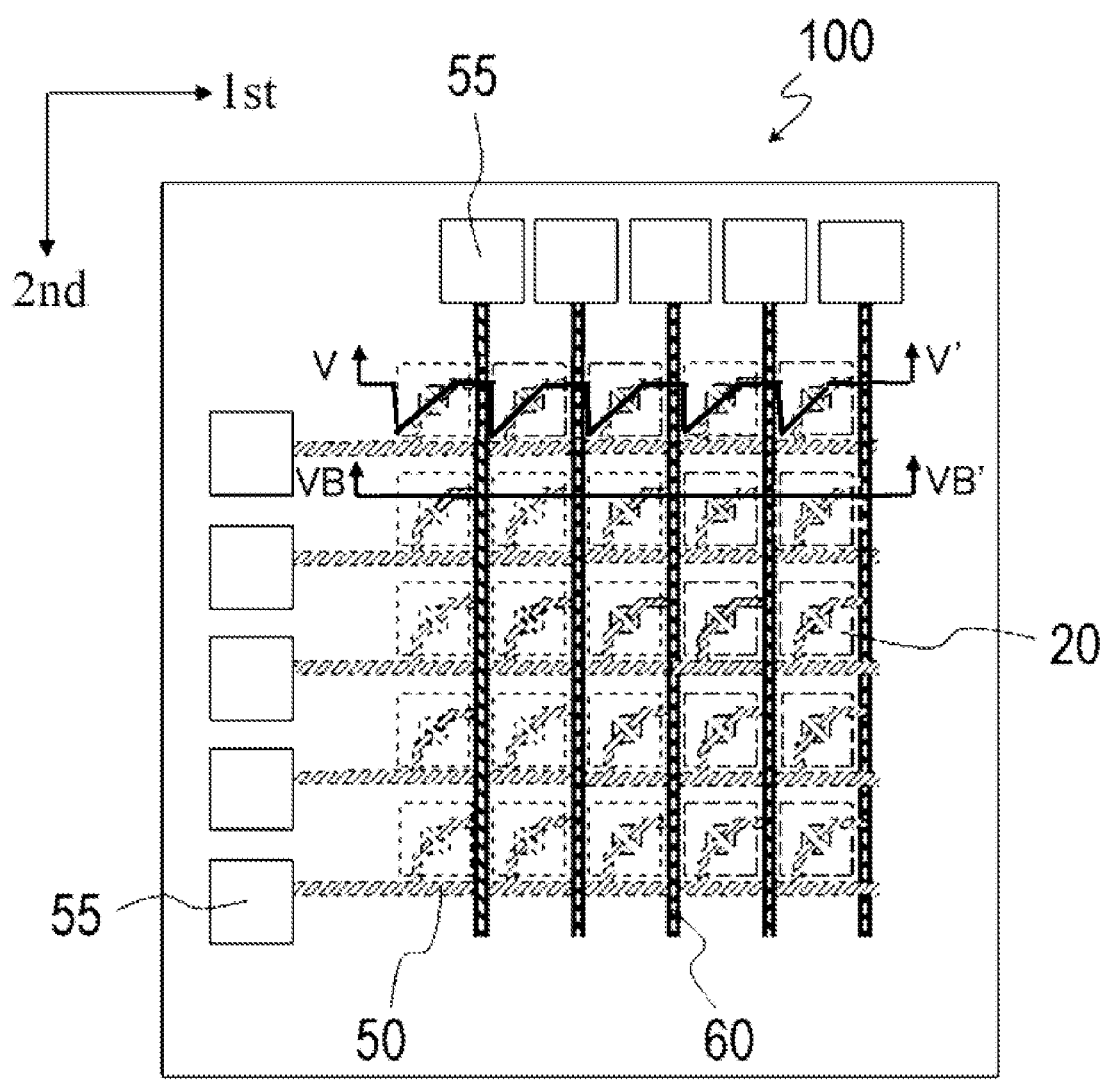
FIG. 1 is a schematic top view of a light-emitting module according to an embodiment.

An embodiment of the present invention will be described below with reference to the accompanying drawings. The embodiment described below is intended to embody the technical idea of the present invention and is not intended to limit the present invention to the embodiment below unless specifically stated otherwise. The sizes, positional relationships, and the like of members shown in the drawings can be exaggerated for clarity of descriptions.

The present invention will be described below in detail on the basis of the accompanying drawings. The descriptions below include terms indicating specific directions or positions (for example, "up", "upper", "down", "lower" and other terms inclusive of these terms) as appropriate. Use of these terms is, however, intended to facilitate understanding of the present invention with reference to the drawings, and the meanings of these terms do not limit the technical scope of the present invention. A portion with the same reference numeral in a plurality of drawings represents the same or equivalent portion or member.

In the embodiment described below, an example of a light-emitting module is described to give concrete form to the technical idea of the present invention, and the present invention is not limited to the description below. Unless otherwise specified, sizes, materials, shapes, and relative positions of constituent components described below are not intended to limit the scope of the present invention thereto, but rather are described as examples. Constitutions described in one embodiment may be applicable to other embodiments or examples. Sizes or positional relationships of components illustrated in the drawings may be exaggerated in order to clarify the descriptions.

Figure 2:
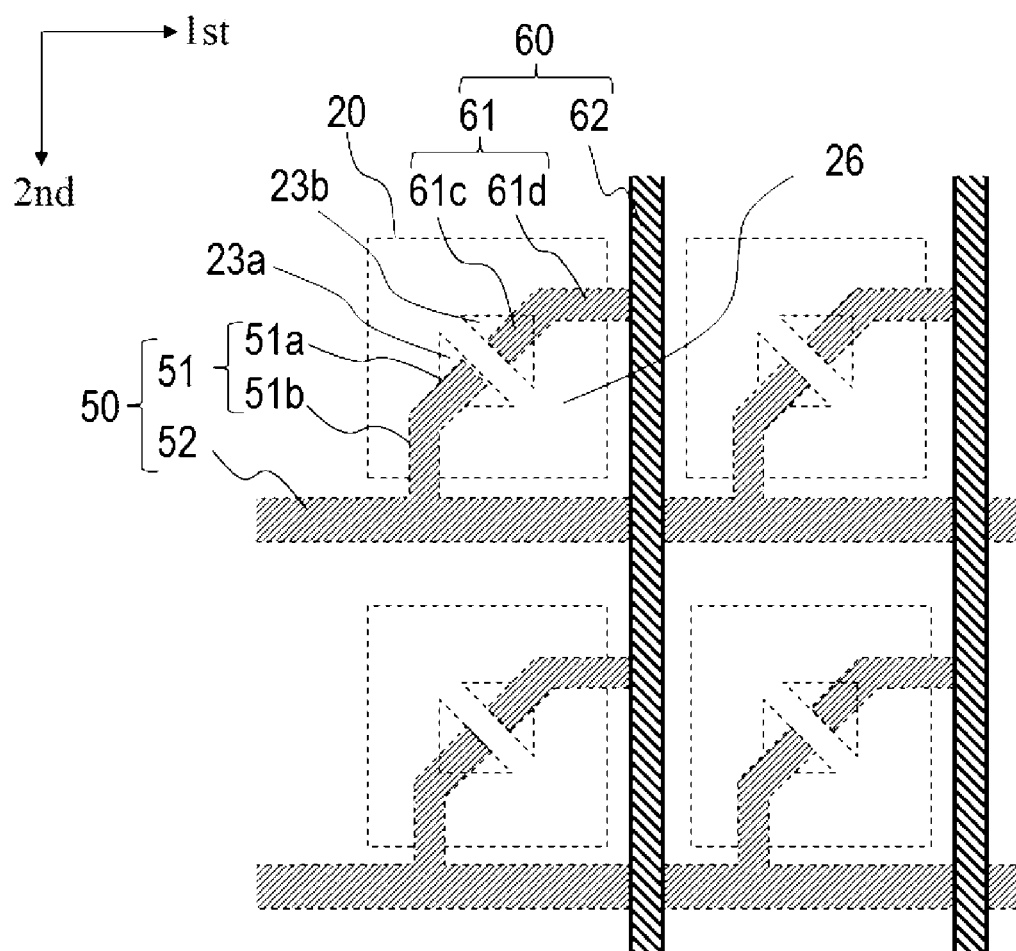
FIG. 2 is a schematic enlarged top view of light sources and their vicinities in FIG. 1.
Figure 3:
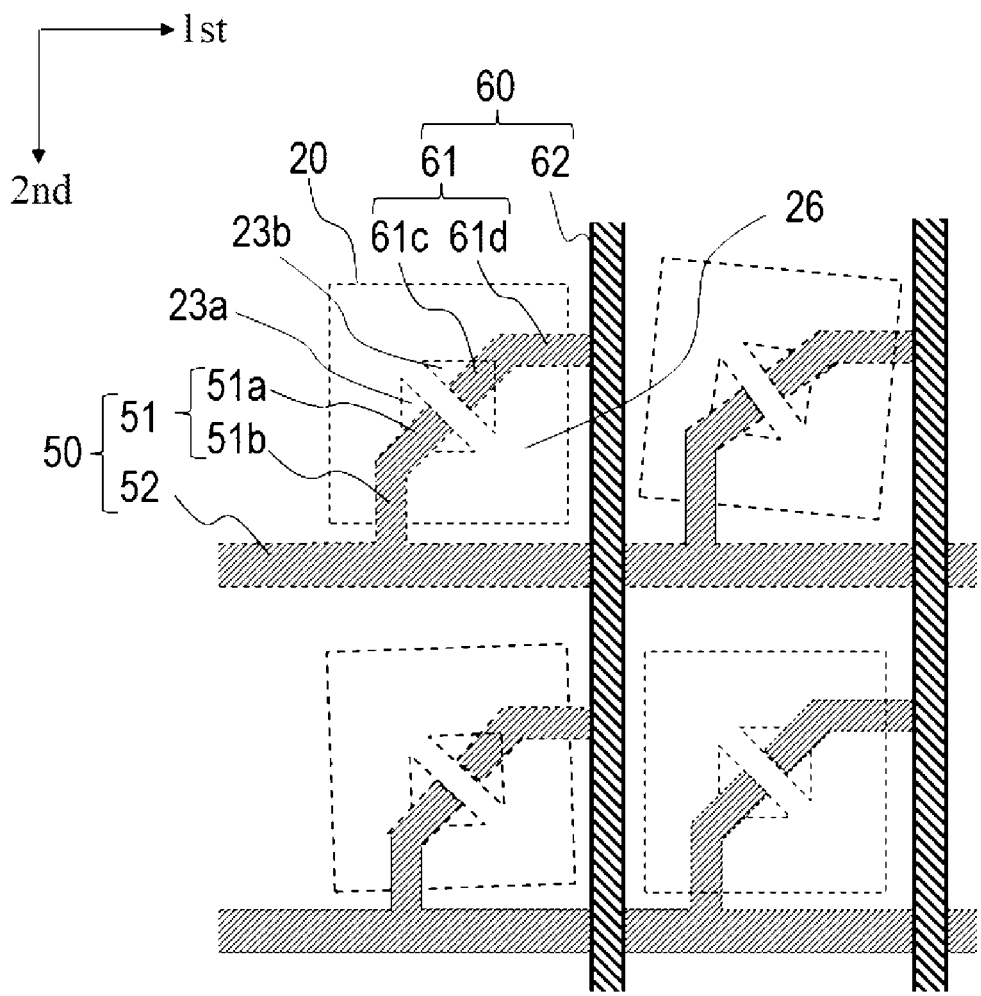
FIG. 3 is a schematic enlarged top view of the light sources and their vicinities in FIG. 1.
Figure 5A:
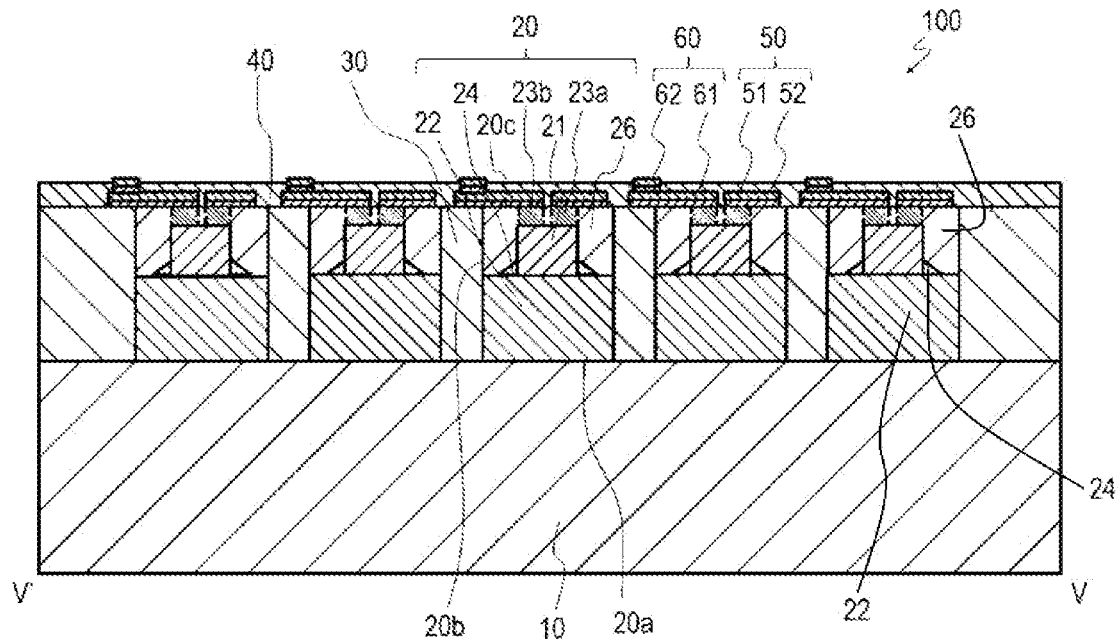
FIG. 5A is a schematic cross-sectional view of the light-emitting module according to the embodiment taken along the line V-V' of FIG. 1.
Figure 5B:
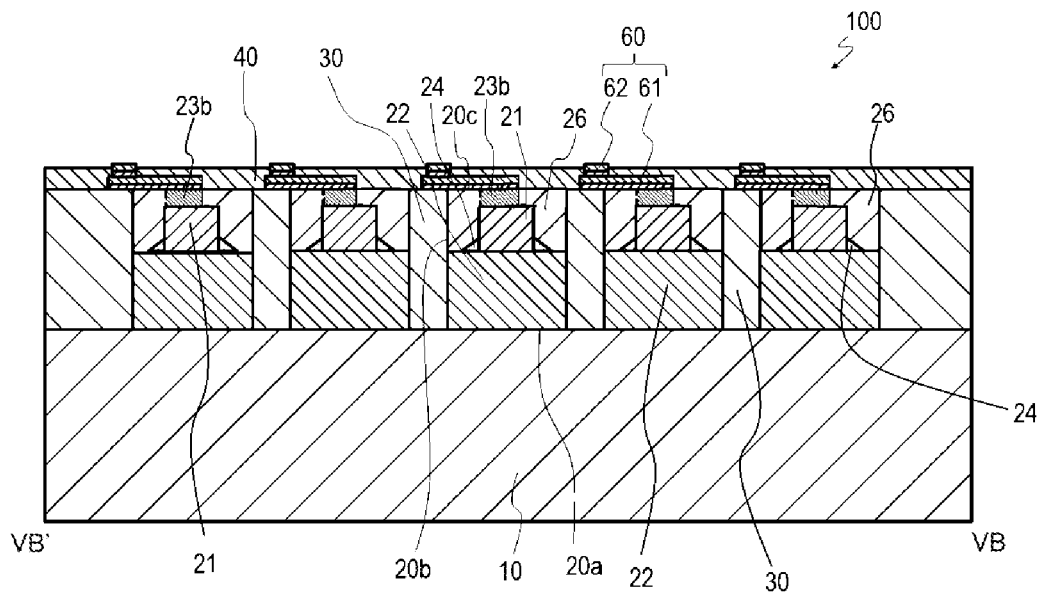
FIG. 5B is a schematic cross-sectional view of the light-emitting module according to the embodiment taken along the line VB-VB' of FIG. 1.
Figure 6:
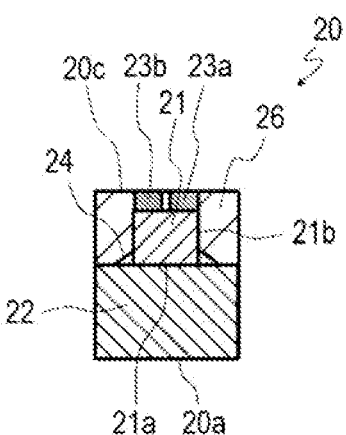
FIG. 6 is a schematic cross-sectional view of a light source in the light-emitting module according to the embodiment.

FIG. 1 is a schematic top view of a light-emitting module obtained by a manufacturing method according to the present embodiment. FIG. 2 and FIG. 3 are schematic enlarged views of light sources 20 and their vicinities in FIG. 1. FIGS. 5A and 5B are schematic cross-sectional views of the light-emitting module obtained by the manufacturing method according to the present embodiment. FIG. 6 is a schematic cross-sectional view of a light source in the light-emitting module according to the present embodiment.

The light-emitting module includes a board 10, a plurality of light sources disposed on the upper surface of the board 10, a covering layer 30 disposed around the light sources, an insulating member 40, first wiring 50, and second wiring 60. The light sources 20 are two-dimensionally arranged in a plurality of rows and a plurality of columns. The arrangement of the light sources 20 is not limited to a two-dimensional arrangement but can be any arrangement appropriately determined such as a honeycomb arrangement.

In the example shown in FIG. 1 and FIG. 2, the light sources 20 are arranged along a first direction ("1st" in Figures) and a second direction ("2nd" in Figures) in a light-emitting module 100. In the present specification, the term "first direction" refers to a direction (lateral direction in FIG. 1) in which the rows of the light sources 20 extend, and the term "second direction" refers to a direction (vertical direction in FIG. 1) in which the columns of the light sources 20 extend.

In the present example, each of the light sources 20 has a square shape in a top view. The length of each side of the square shape can be within the range of, for example, about 15 μm or more and about 1,000 μm or less. In the present example, the light-emitting module also has a quadrangular outer shape. The lengths of the quadrangular light-emitting module in the longitudinal and lateral directions are respectively, for example, 8 cm and 6 cm. The number and shape of the light sources 20 in the light-emitting module 100 can be appropriately determined, and the shape of the light-emitting module 100 can also be appropriately determined.

Each of the light sources 20 has an electrode formation surface 20c and an emission surface 20a opposite to the electrode formation surface 20c. The electrode formation surface 20c is provided with a pair of positive and negative electrodes, that is, a first electrode 23a and a second electrode 23b, on the same surface. The light source 20 is disposed directly or with a bonding member or the like therebetween such that the emission surface 20a faces the upper surface of the board 10.

The light source 20 includes a light-emitting element 21. A light-transmissive member 22 is disposed on an emission surface 21a of the light-emitting element 21. The light-emitting element 21 is bonded to the light-transmissive member 22 with a light-transmissive adhesive member 24. The light-transmissive member 22 covers the emission surface 21a of the light-emitting element 21 and extends outward of lateral surfaces 21b of the light-emitting element.

The lateral surfaces 21b of the light-emitting element 21 are covered with a covering member 26. The covering member 26 constitutes a portion of the electrode formation surface 20c of the light source 20. The covering member 26 is also disposed on an electrode formation surface of the light-emitting element 21 such that at least a portion of the surface of each of the first electrode 23a and the second electrode 23b of the light-emitting element 21 are exposed from the upper side of the light source 20.

The covering layer 30 covers lateral surfaces 20b of the light source 20. In the example shown in FIGS. 5A and 5B, the electrode formation surface 20c of the light source 20 is exposed from the covering layer 30. The electrode formation surface 20c of the light source 20 can be covered with the covering layer 30 except for the regions in which the first electrode 23a and the second electrode 23b are disposed.

The first wiring 50 is disposed over the light sources 20 and the covering layer 30. The first wiring 50 includes first extending portions 51 and first connecting portions 52. Each of the first extending portions 51 is disposed for the first electrode 23a of a corresponding one of the light sources 20 and extends from the first electrode 23a in the second direction. The first connecting portions 52 extend in the first direction and each electrically connect a plurality of first extending portions 51. The first connecting portions 52 are provided with external terminals 55. Each of the first connecting portions 52 is integrally formed with the first extending portions 51 in the light-emitting module.

The second wiring 60 is disposed over the light sources 20 and the covering layer 30. The second wiring 60 includes second extending portions 61 and second connecting portions 62. Each of the second extending portions 61 is provided for the second electrode 23b of a corresponding one of the light sources 20, and extends from the second electrode 23b in the first direction. The length of the second extending portion 61 in its extending direction is greater than the width of the second extending portion 61 in a direction perpendicular to the extending direction in a top view. Making the second extending portion 61 extending from the second electrode 23b such that the second extending portion 61 is elongated can facilitate alignment when each second connecting portion 62 connected to a plurality of second extending portions 61 is formed.

The insulating member 40 covers a plurality of first connecting portions 52. In the example shown in FIGS. 5A and 5B, the insulating member 40 is disposed over the light sources 20, the first wiring 50, the second extending portions 61, and the covering layer 30. The insulating member 40 has openings in each of which at least a portion of the second extending portion 61 is exposed. The openings are located away from the second electrodes 23b in a top view.

The second connecting portions 62 extend in the second direction, and each electrically connect a plurality of second extending portions 61 at the openings of the insulating member 40. The second connecting portions 62 are provided with external terminals 55.

Figure 4:
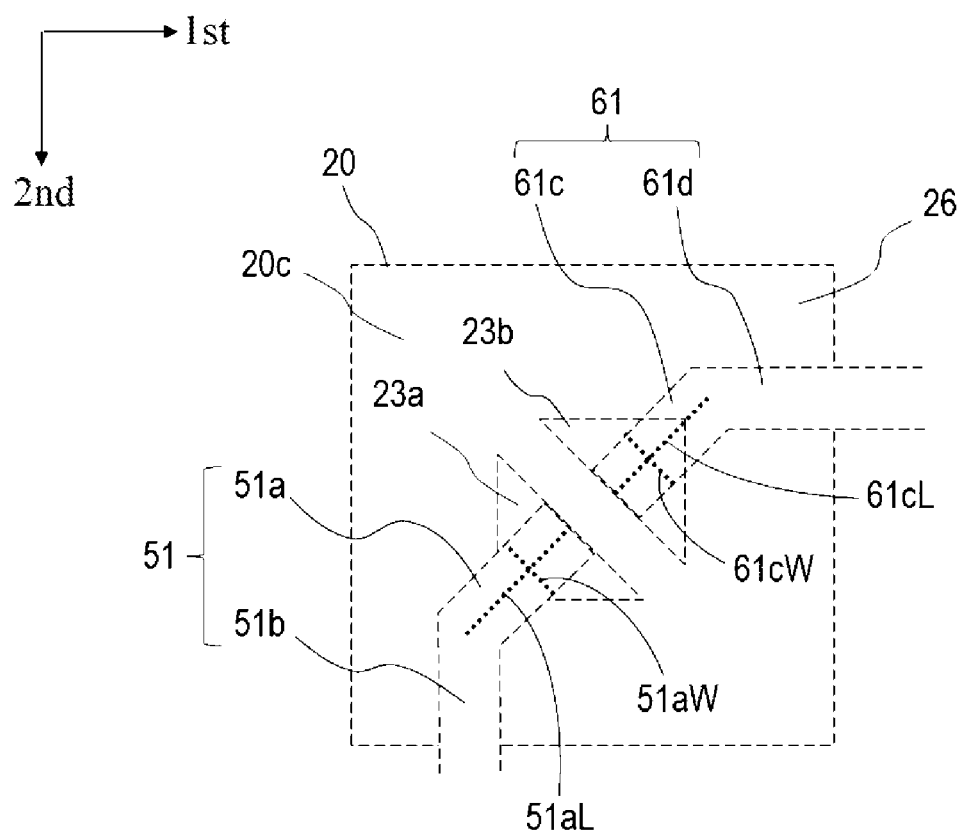
FIG. 4 is a schematic further enlarged top view of a light source and its vicinity in FIG. 3.

FIG. 4 is a schematic further enlarged top view of a light source 20 and its vicinity in FIG. 3. In FIG. 4, the first electrode 23a and the second electrode 23b are respectively located in portions on a line connecting diagonally opposite corners of the electrode formation surface 20c of the rectangular light source 20. In FIG. 4, the first electrode 23a and the second electrode 23b are right triangular and are separated from each other along a diagonal line of the electrode formation surface 20c of the rectangular light source 20. The first extending portion 51 includes a first portion 51a and a second portion 51b. The first portion 51a extends from the first electrode 23a toward the corner of the electrode formation surface 20c which is located opposite side from the second electrode 23b, in a top view. The second portion 51b extends in the second direction, and connects the first portion 51a to the first connecting portion 52. A length 51aL of the first portion 51a in its elongated direction is greater than a width 51aW of the first portion 51a in a direction perpendicular to the elongated direction in a top view. The second extending portion 61 includes a third portion 61c extending from the second electrode 23b toward the corner of the electrode formation surface 20c which is located opposite side from the first electrode 23a, in a top view. The fourth portion 61d extends in the first direction, and connects the third portion 61c to the second connecting portion 62. A length 61cL of the third portion 61c in its elongated direction is greater than a width 61cW of the third portion 61c in a direction perpendicular to the elongated direction in a top view. This structure allows for effectively reducing a short circuit between the first extending portion 51 and the second extending portion 61. The shapes of the first electrode 23a and the second electrode 23b in a top view are not limited to triangular but can be, for example, rectangular.

The method of manufacturing the light-emitting module will be described in detail referring to schematic cross-sectional views of FIG. 7 to FIG. 13 and FIG. 15 to FIG. 19.

Step of Providing Intermediate Structure

An intermediate structure 90 in which a plurality of light sources 20 and the covering layer 30 are disposed on the board 10 is provided.

Figure 7:
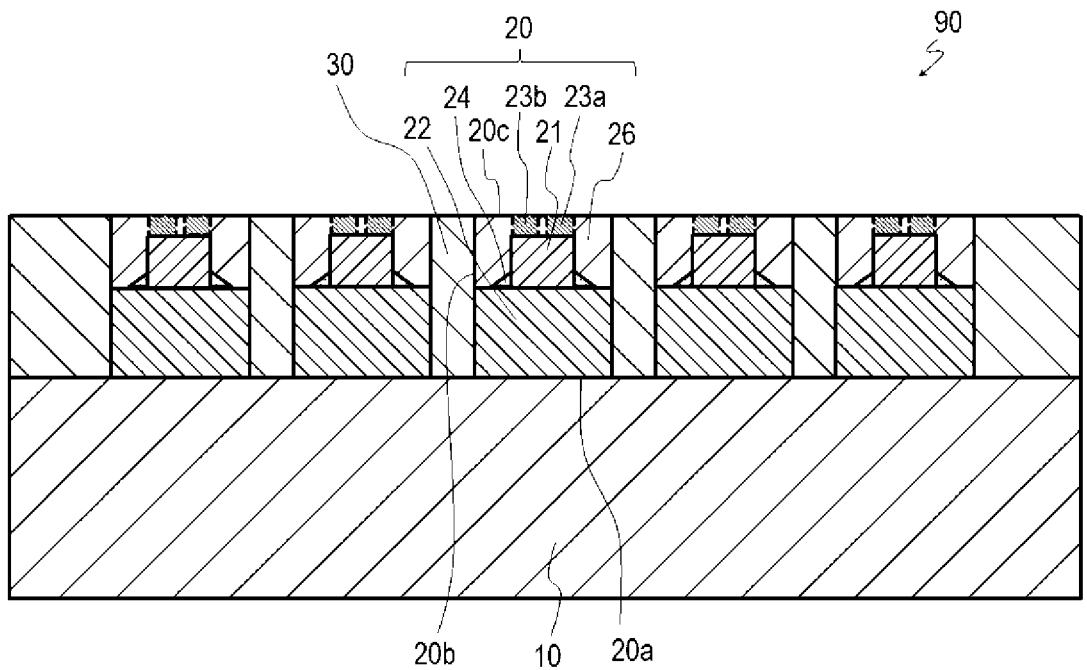
FIG. 7 is a schematic cross-sectional view showing a step of a method of manufacturing the light-emitting module according to the embodiment.

As shown in FIG. 7, the light sources 20 are disposed on the board 10. The light sources 20 are arranged on the upper surface of the board 10 along the first direction and the second direction. The light sources 20 are disposed with their electrode formation surfaces 20c facing up and their emission surfaces 20a facing down. In the light-emitting module, the light sources 20 are arranged at predetermined intervals. The light sources 20 can be disposed without intervals such that lateral surfaces of the light sources 20 are brought into contact with each other. In this case, a step of forming the covering layer 30 described below can be omitted to dispose the first wiring 50 and the second wiring 60 on the light sources 20.

The board 10 is such a board that the light sources 20 can be placed. The shape of the board 10 is not limited to particular shapes, but its upper surface is preferably flat. The light sources 20 are bonded to the board 10 with light-transmissive bonding members. Examples of the bonding members include epoxy resins.

Subsequently, the covering layer 30 is formed around the light sources 20 on the board 10. The covering layer 30 is disposed by applying the material of the covering layer 30 over the board. The method of applying the cover layer 30 is not limited to particular methods, and examples thereof include spin coating using a spin coater and discharging using a dispenser. The covering layer 30 can be formed of, for example, a polyimide or an epoxy resin.

The covering layer 30 can be formed so as to cover the board 10 and the light sources 20 with the material of the covering layer 30, and then partially removing the covering layer 30 until the first electrodes 23a and the second electrodes 23b of the light sources 20 are exposed.

Step of Forming Wiring

Wiring including the first wiring 50 and the second wiring 60 is formed on the upper surface of the resulting intermediate structure. A step of forming wiring includes a step of forming the first wiring 50 and the second extending portions 61, a step of forming the insulating member 40, and a step of forming the second wiring by forming the second connecting portions 62.

Step of Forming First Wiring 50 and Second Extending Portions 61

The first wiring 50 including the first extending portions 51 and the first connecting portions 52, and the second extending portions 61 that are a portion of the second wiring 60, are first formed. The positions of the first electrodes 23a and the second electrodes 23b of the respective light sources 20 are detected, and the first extending portions 51 and the second extending portions 61 are formed so as to respectively correspond to the positions of the first electrodes 23a and the second electrodes 23b. The first wiring 50 and the second extending portions 61 are formed by layering a first metal layer 71 and a second metal layer 72.

Figure 8:
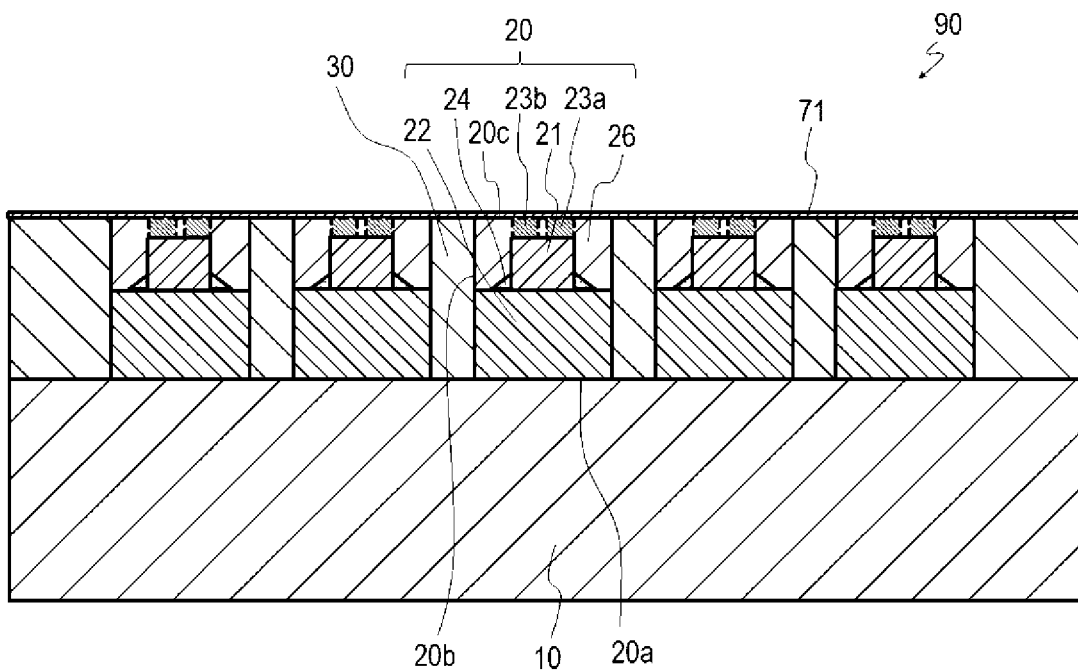
FIG. 8 is a schematic cross-sectional view showing a step of the method of manufacturing the light-emitting module according to the embodiment.

In the step of forming the first wiring 50 and the second extending portions 61, the first metal layer 71 is formed by sputtering or the like over substantially the entire upper surfaces of the light sources 20 and the covering layer 30 as shown in FIG. 8. The first metal layer 71 is used as a seed layer for formation of the second metal layer 72 by electroplating in a step of forming the second metal layer 72 that is a subsequent step. Examples of the layered structure of the first metal layer 71 include Ti/Cu layered in this order from the board 10.

Figure 9:
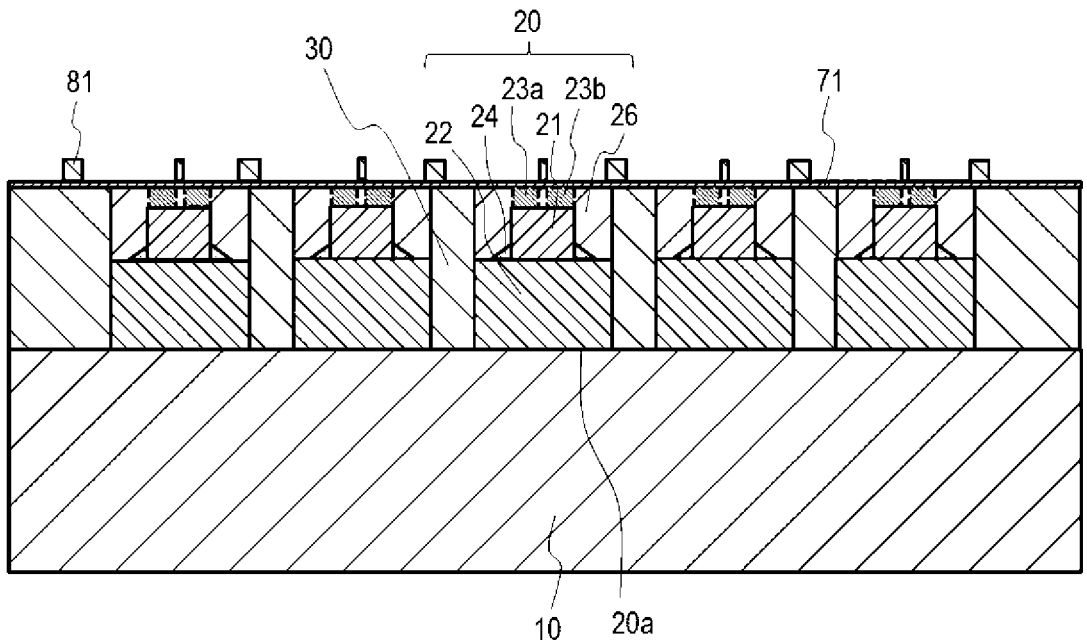
FIG. 9 is a schematic cross-sectional view showing a step of the method of manufacturing the light-emitting module according to the embodiment.

Subsequently, a resist 81 is formed on the first metal layer 71 as shown in FIG. 9. The resist 81 has openings corresponding to the first extending portions 51, the first connecting portions 52, and the second extending portions 61 in a top view. The resist 81 can be formed into a desired shape corresponding to the pre-detected positions of the first electrodes 23a and the second electrodes 23b by direct writing using ultraviolet laser light or the like.

Figure 10:
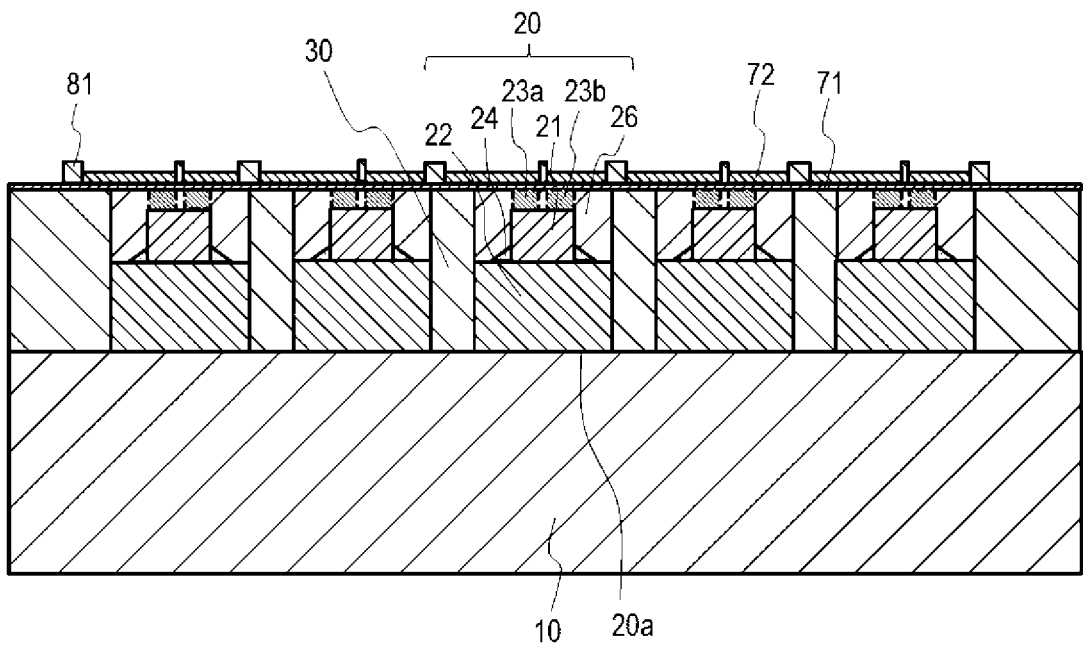
FIG. 10 is a schematic cross-sectional view showing a step of the method of manufacturing the light-emitting module according to the embodiment.

Subsequently, the second metal layer 72 is formed in the openings of the resist 81 by electroplating as shown in FIG. 10. The second metal layer 72 is formed by plating growth in the openings of the resist using the first metal layer 71 as the seed layer, which is the current path, for electroplating. Examples of the second metal layer 72 include Cu.

Figure 11:
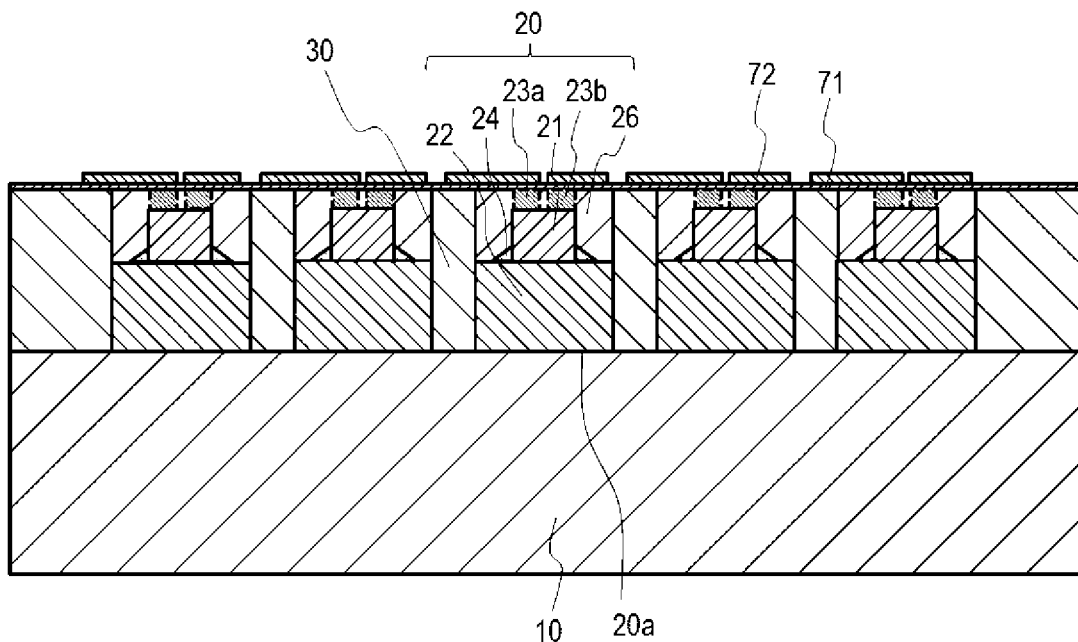
FIG. 11 is a schematic cross-sectional view showing a step of the method of manufacturing the light-emitting module according to the embodiment.
Figure 12:
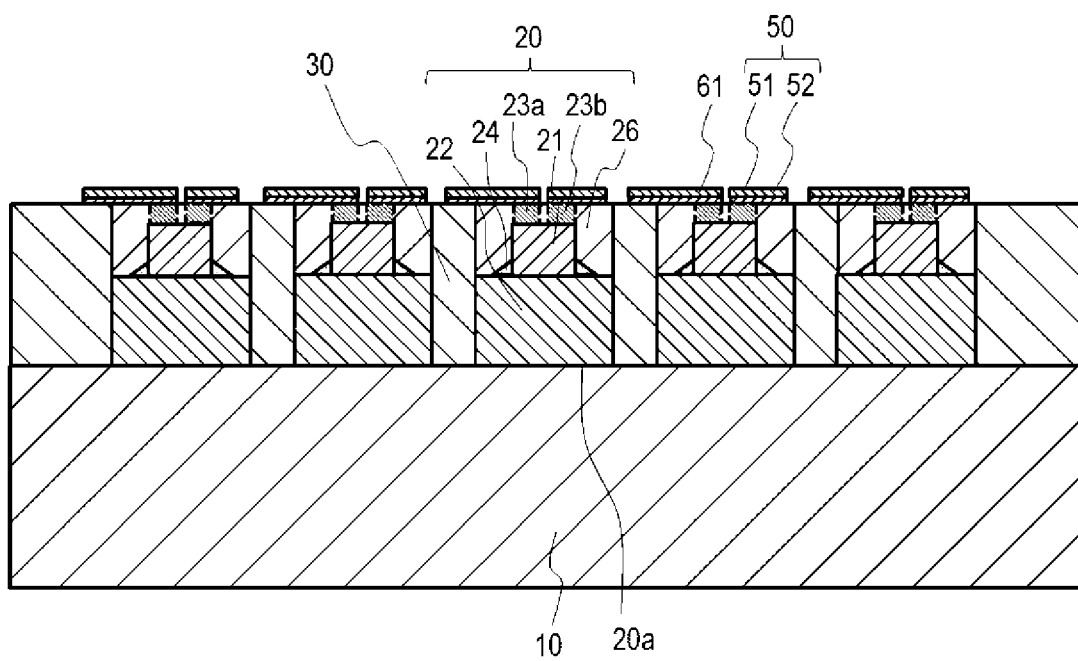
FIG. 12 is a schematic cross-sectional view showing a step of the method of manufacturing the light-emitting module according to the embodiment.

The resist is then removed to expose the first metal layer 71 as shown in FIG. 11. Subsequently, etching is performed to reduce the thickness of the second metal layer 72 by partially removing the second metal layer 72 and to remove portions of the first metal layer 71 where the second metal layer 72 is not provided, as shown in FIG. 12. The first wiring 50 and the second extending portions 61 formed by layering the first metal layer 71 and the second metal layer 72 are thus formed. The etching can be either dry etching or wet etching.

In the case in which the light sources 20 each have a quadrangular shape in a top view as shown in FIG. 2, it is preferable that the pair of the first electrode 23a and the second electrode 23b are triangular in a top view and located diagonally opposite to each other on each light source 20. This structure can enlarge the pair of the first electrode 23a and the second electrode 23b in the first direction and the second direction even in a small light source, so that sufficient areas for bonding to the pair of the first extending portion 51 and the second extending portion 61 to be formed on the first electrode 23a and the second electrode 23b can be obtained.

Step of Forming Insulating Member 40

Figure 13:
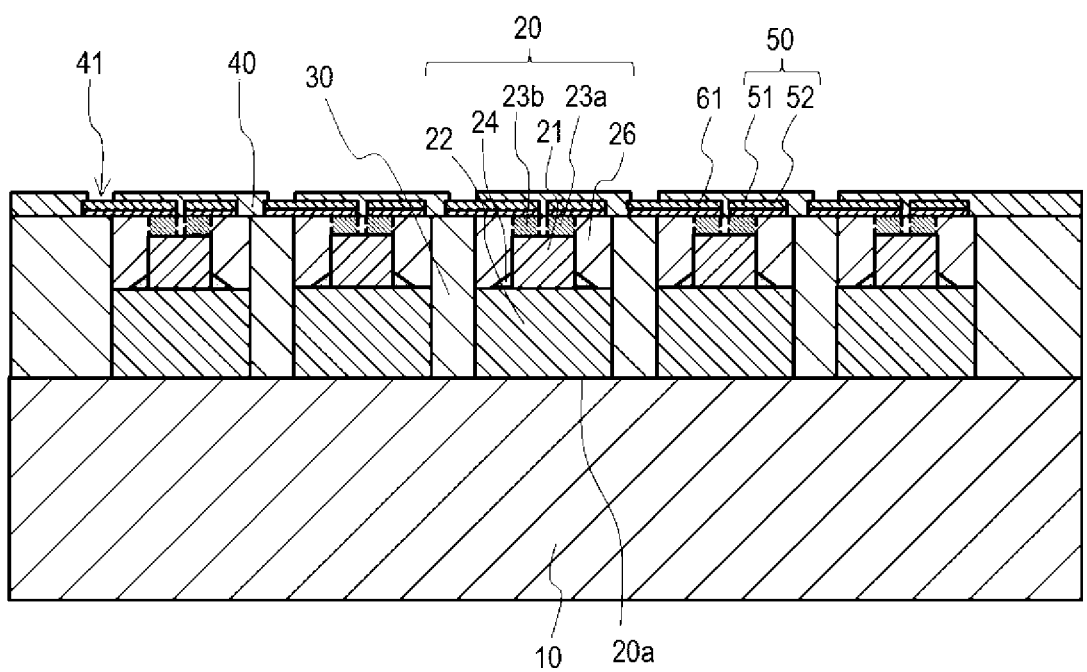
FIG. 13 is a schematic cross-sectional view showing a step of the method of manufacturing the light-emitting module according to the embodiment.
Figure 14:
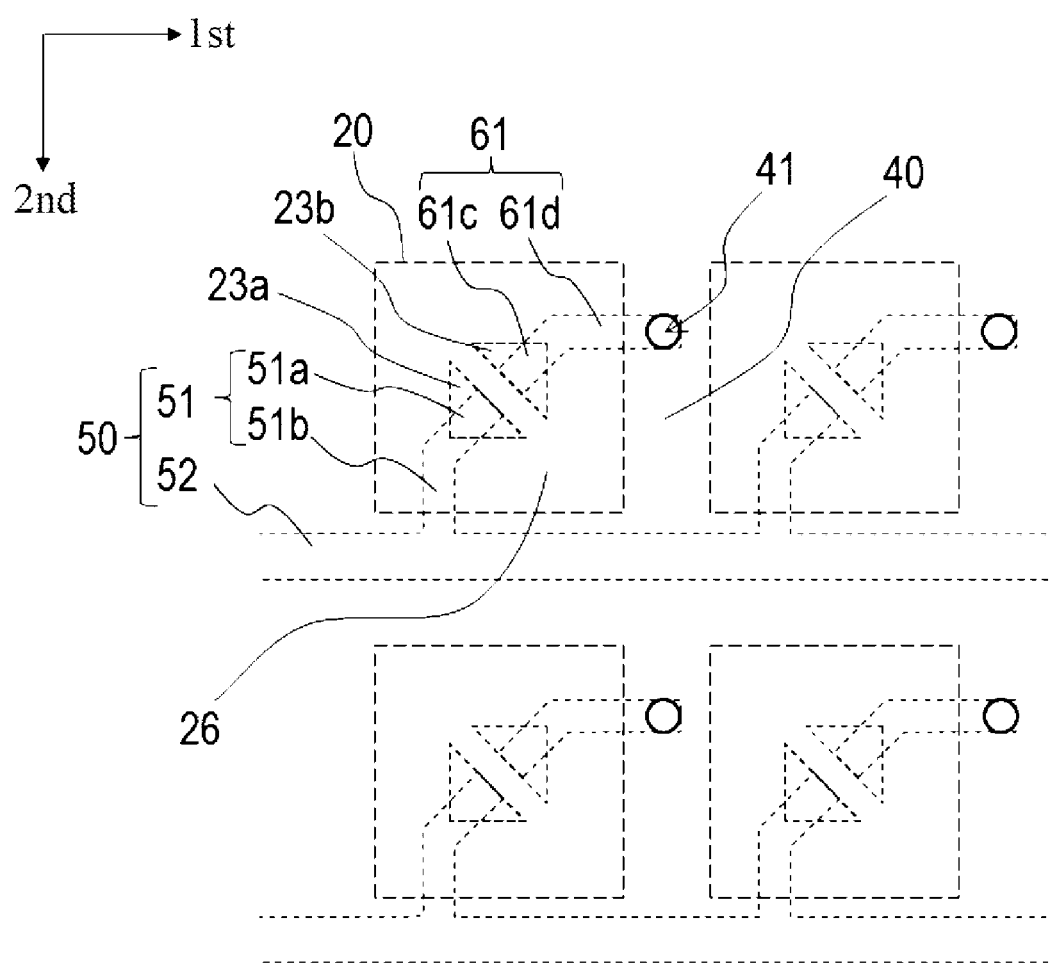
FIG. 14 is a schematic top view showing a step of the method of manufacturing the light-emitting module according to the embodiment.

Subsequently, the insulating member 40 is formed on the first wiring 50 and the second extending portions 61 as shown in FIG. 13. The insulating member 40 is disposed at least over the first connecting portions 52 and between the first connecting portions 52 and the second connecting portions 62 described below. In the example shown in FIG. 13, the insulating member 40 is formed over the first wiring 50 and the second extending portions 61. After the insulating member 40 is formed, the insulating member 40 is patterned by, for example, photolithography to cover the first wiring 50 and the second extending portions 61 and have openings 41 at positions overlapping with the second extending portions 61 in a top view. FIG. 14 is a schematic enlarged view of a portion of the light-emitting module after the insulating member 40 is formed. As shown in FIG. 14, the openings 41 of the insulating member 40 overlap with the second extending portions 61, and the second extending portions 61 are partially exposed at the positions of the openings 41. The insulating member 40 can be formed of, for example, a silicone or epoxy resin which are photosensitive. The insulating member 40 is formed by, for example, transfer molding, compression molding, potting, printing, or spraying to have such a thickness (such as about 2 µm to 500 µm) that the first wiring 50 and the second extending portions 61 are embedded inside on the light sources 20 and the covering layer 30.

Step of Forming Second Connecting Portions 62

Subsequently, the second connecting portions 62 each of which electrically connect a plurality of second extending portions 61 are formed. The second connecting portions 62 are formed by layering a third metal layer 73 and a fourth metal layer 74.

Figure 15:
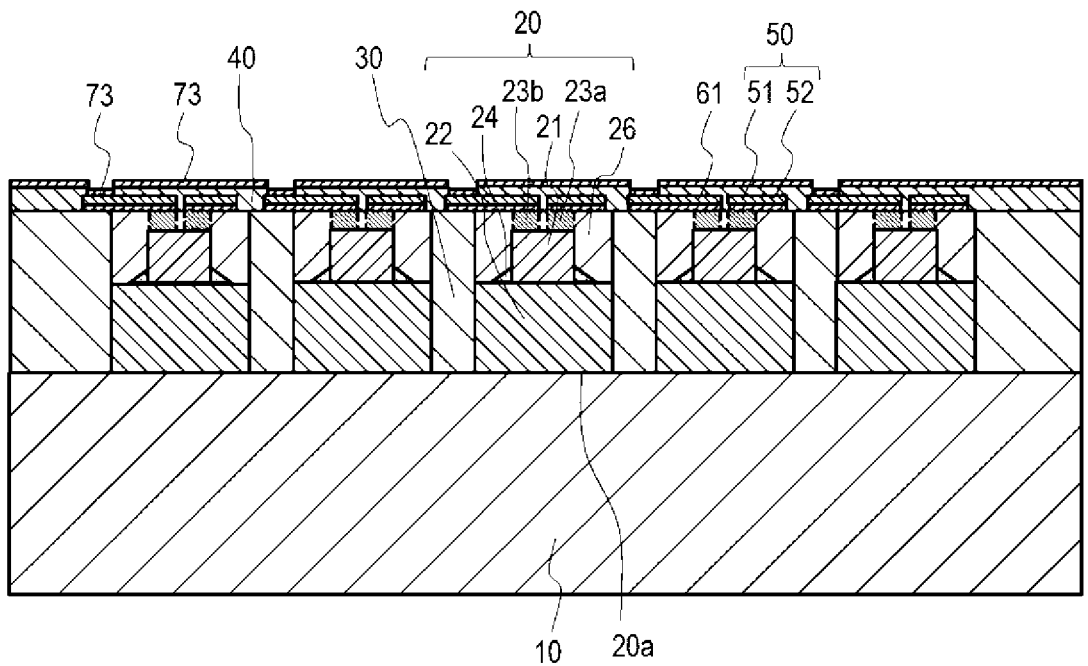
FIG. 15 is a schematic cross-sectional view showing a step of the method of manufacturing the light-emitting module according to the embodiment.

In the step of forming the second connecting portions 62, the third metal layer 73 is first formed by sputtering or the like over substantially the entire upper surfaces of the insulating member 40 and the second extending portions 61 exposed in the openings as shown in FIG. 15. The third metal layer 73 is used as a seed layer for formation of the fourth metal layer 74 by electroplating in a step of forming the fourth metal layer 74, which is a subsequent step. Similarly to the materials of the first metal layer 71, examples of the layered structure of the third metal layer 73 include Ti/Cu layered in this order from the board 10.

Figure 16:
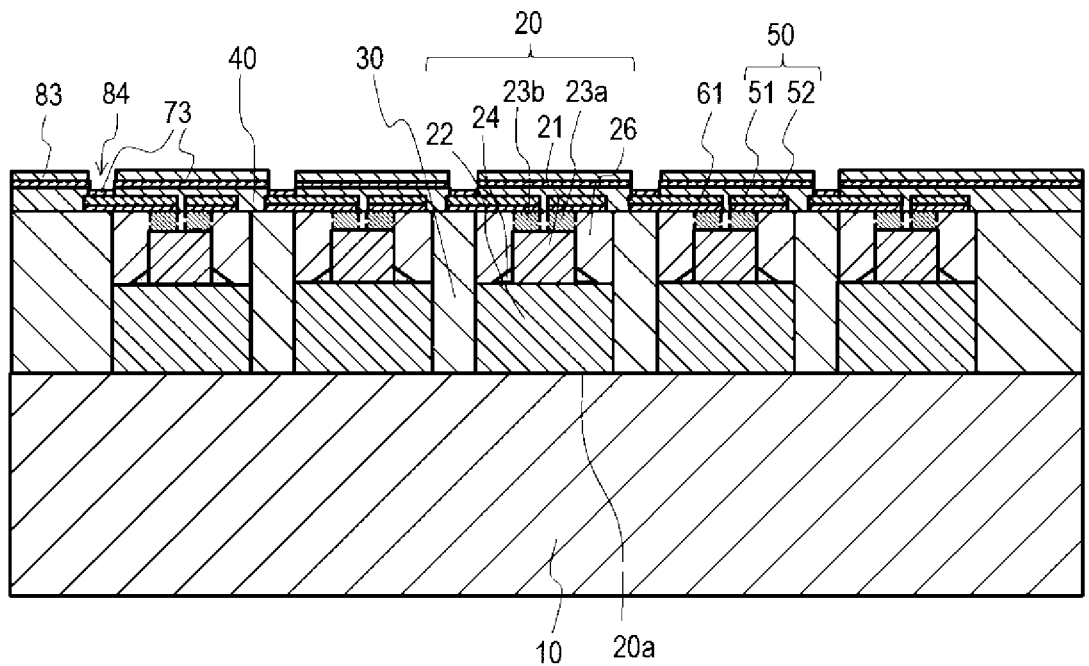
FIG. 16 is a schematic cross-sectional view showing a step of the method of manufacturing the light-emitting module according to the embodiment.

Subsequently, a resist 83 is formed on the third metal layer 73 as shown in FIG. 16. The resist 83 has openings 84 corresponding to the second connecting portions 62.

Figure 17:
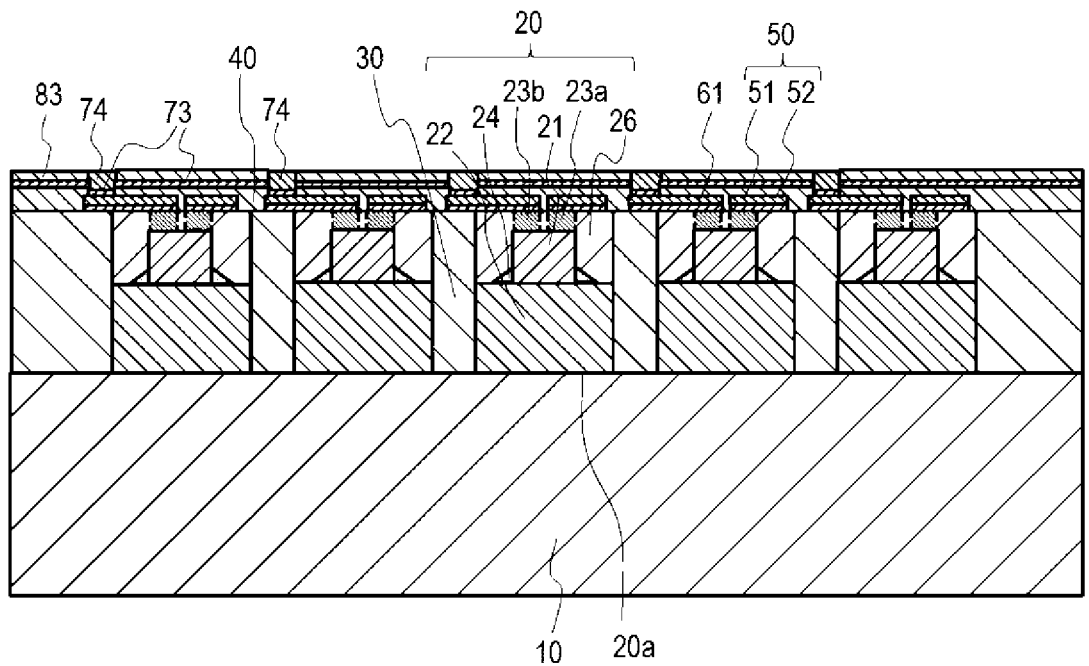
FIG. 17 is a schematic cross-sectional view showing a step of the method of manufacturing the light-emitting module according to the embodiment.

Subsequently, the fourth metal layer 74 is formed in the openings 84 of the resist 83 by electroplating as shown in FIG. 17. The fourth metal layer 74 is formed by plating growth in the openings of the resist using the third metal layer 73 as the seed layer, which is the current path, for electroplating. Similarly to the second metal layer 72, examples of the material of the fourth metal layer 74 include Cu.

Figure 18:
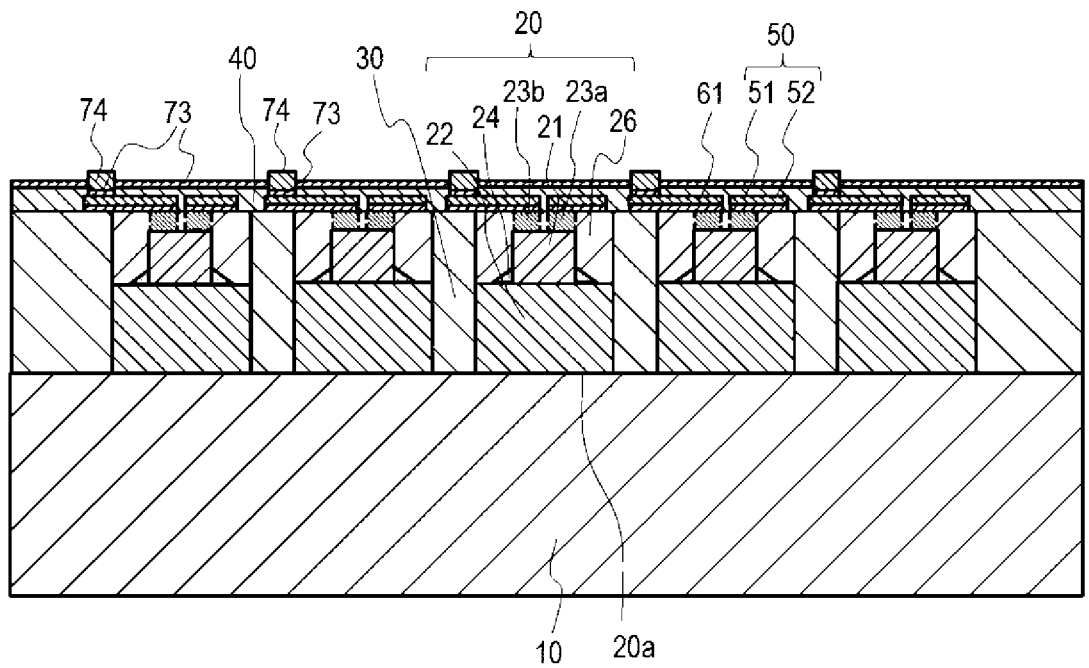
FIG. 18 is a schematic cross-sectional view showing a step of the method of manufacturing the light-emitting module according to the embodiment.
Figure 19:
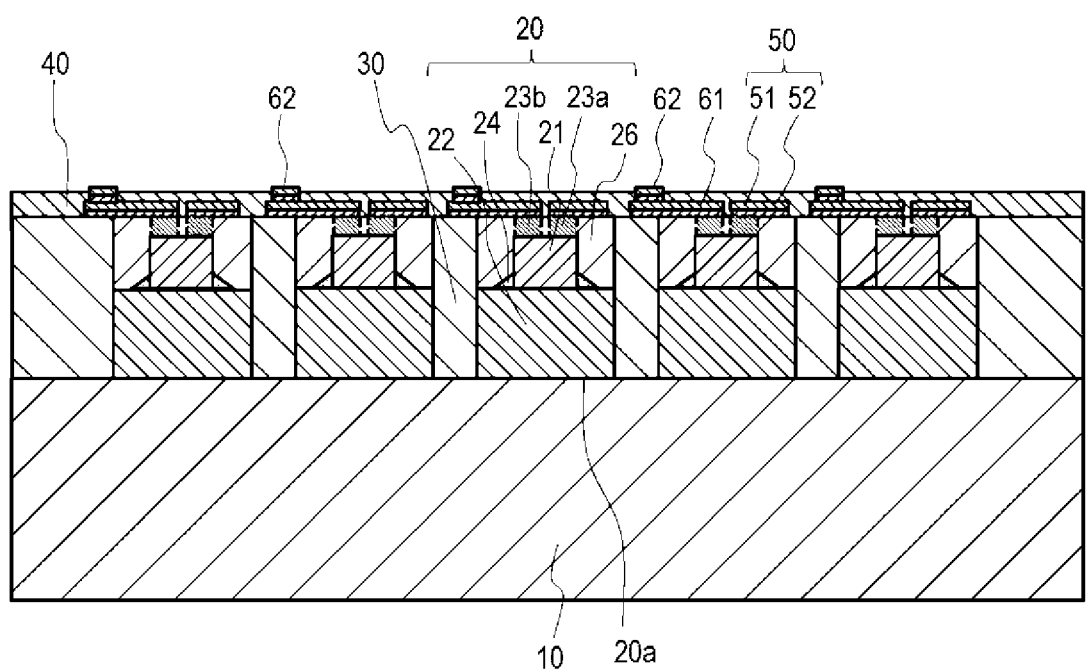
FIG. 19 is a schematic cross-sectional view showing a step of the method of manufacturing the light-emitting module according to the embodiment.
Figure 20:
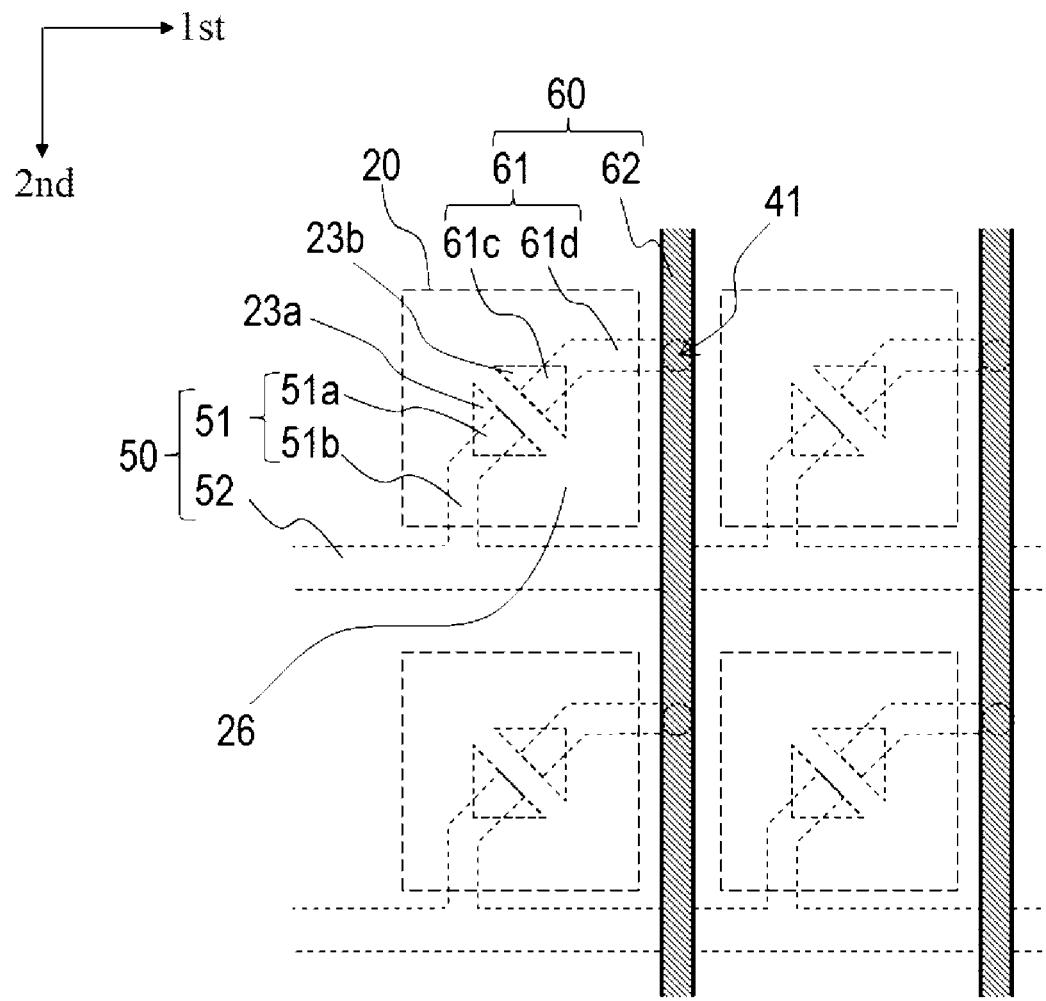
FIG. 20 is a schematic top view showing a step of the method of manufacturing the light-emitting module according to the embodiment.

The resist is then removed to expose the third metal layer 73 as shown in FIG. 18. Further, etching is performed to reduce the thickness of the fourth metal layer 74 by partially removing the fourth metal layer 74 and to remove portions of the third metal layer 73 where the fourth metal layer 74 is not provided. The second connecting portions 62 made by layering third metal layer 73 and the fourth metal layer 74 are thus formed as shown in FIG. 19. The second connecting portions 62 extend in the second direction and are electrically connected to the second extending portions 61 aligned in the second direction at the positions of the openings 41 through the openings 41 as shown in FIG. 20. This structure can allow the second electrodes 23b of the light sources 20 aligned in the second direction to be electrically connected to each other with the second connecting portions 62. In the step of forming the second connecting portions 62, the external terminals 55 can be formed at the same time.

The light-emitting module 100 having the structure shown in FIGS. 5A and 5B can be obtained in this way. The first extending portions 51 of the first wiring 50 and the second extending portions 61 of the second wiring 60 respectively correspond to the positions of the first electrodes 23a and the second electrodes 23b of the light sources 20, so that the first electrodes 23a and the second electrodes 23b of the light sources 20 can be securely connected to the first wiring 50 and the second wiring 60, respectively. For example, even if a light source 20 is misaligned in a step of disposing the light sources 20 or the like as shown in FIG. 3, the first extending portion 51 and the second extending portion 61 can be precisely arranged with respect to the first electrode 23a and the second electrode 23b by modifying the angle of the first portion 51a of the first extending portion 51, the angle of the third portion 61c of the second extending portion 61, the length of the second portion 51b of the first extending portion 51, and/or the length of the fourth portion 61d of the second extending portion 61. With this structure, poor connections caused by misalignment of the first electrode 23a and the second electrode 23b of the light source 20 to the first wiring 50 and the second wiring 60 can be reduced compared with the case in which the electrodes of the light source 20 are disposed to face wiring formed on the board. The first wiring 50 and the second extending portions 61 are formed in the same step, so that the manufacturing steps can be simplified. The first wiring 50 does not overlap with the second extending portions 61, so that the light-emitting module with the reduced thickness can be obtained. The second extending portions 61 provided for the electrodes of the light sources is formed in the different step from the second connecting portions 62, to thereby efficiently forming the second wiring.

Each component of the light-emitting module will be described below.

Board 10

The shape of the board 10 is not limited to particular shapes as long as the light sources 20 and the covering layer 30 can be disposed on the upper surface of the board 10, but the upper surface is preferably flat. An insulating board can be used as the board 10. The board 10 is preferably light transmissive but is not limited thereto. For example, glass or ceramic is preferably used for the board 10. The board 10 can be flexible. The thickness of the board 10 is not limited to particular values but is, for example, about 0.1 mm to 1 mm.

In the example shown in FIGS. 5A and 5B, the upper surface of the board 10 is flat. The upper surface of the board 10 may not necessarily be flat. The upper surface can have recesses respectively corresponding to the light sources 20, and the light sources 20 can be disposed in the recesses.

Covering Layer 30

The covering layer 30 covers lateral surfaces of the light sources 20. A light-reflective material can be used for the covering layer 30. The light-reflective covering layer 30 preferably has a reflectance of 60% or more, more preferably 90% or more, with respect to light emitted from the light sources 20. The material of the light-reflective covering layer 30 can be resin containing a white pigment or the like. In particular, a silicone resin containing titanium oxide as a light-reflective material (or a light-scattering material) is preferable. Using an inexpensive material such as titanium oxide as a material that is used in a relatively large amount to cover a surface of the board 10 allows the light-emitting module to be inexpensive. The covering layer 30 can be formed of a light-transmissive material such as resin not containing a white pigment or the like.

As the base material of the resin material constituting the covering layer 30, a silicone resin, a phenolic resin, an epoxy resin, a BT resin, polyphthalamide (PPA), or the like can be used. As the light-reflective material, metal particles or particles of an inorganic or organic material having a refractive index higher than the refractive index of the base material can be used. Examples of the light-reflective material include particles of titanium dioxide, silicon oxide, zirconium dioxide, potassium titanate, aluminum oxide, aluminum nitride, boron nitride, mullite, niobium oxide, or barium sulfate and particles of rare-earth oxides such as yttrium oxide and gadolinium oxide.

First Wiring 50 and Second Wiring 60

The first wiring 50 and the second wiring 60 are electrically connected to the first electrodes 23a and the second electrodes 23b of the light sources 20 respectively. With the first wiring 50 and the second wiring 60, for example, a plurality of light sources 20 can be electrically connected to each other, and a circuit required for local dimming or the like can be easily formed.

The material of the first wiring 50 and the second wiring 60 preferably has a low electrical resistance, and examples of the material include a material containing at least one selected from the group consisting of Cu, Au, and Al. Among these materials, Cu is preferable. The thicknesses of the first wiring 50 and the second wiring 60 are not limited to particular values but are, for example, about 10 nm to 100 μm.

Light Source 20

In the example shown in FIG. 6, the light source includes the light-transmissive member 22, the light-transmissive adhesive member 24, and the covering member 26 in addition to the light-emitting element 21. The light source 20 can be configured as the light-emitting element 21 itself without including the light-transmissive member 22, the light-transmissive adhesive member 24, and the covering member 26. The thickness of the light source 20 is not limited to particular values but is, for example, about 100 μm to 1 mm.

Light-emitting Element 21

The pair of electrodes are disposed on the same surface of the light-emitting element 21. A known semiconductor light-emitting element formed of a nitride semiconductor or the like can be used as the light-emitting element 21. The light-emitting element 21 that emits light having appropriately selected wavelength can be used to obtain a desired emission color.

Light-emitting diodes with various emission wavelengths can be used for the light-emitting element 21. A phosphor described below can be combined to obtain a desired emission color. In particular, in order to obtain emission of white light, it is preferable to combine a nitride semiconductor light-emitting element that emits blue light with a phosphor that absorbs the blue light to emit yellow, green, or red light.

Light-transmissive Member 22

The light-transmissive member 22 is disposed on the emission surface 21a of the light-emitting element 21. Transparent resin or glass can be used for the light-transmissive member 22. A silicone resin or the like is preferably used as the transparent resin in view of durability, moldability, and the like.

Figure 21:
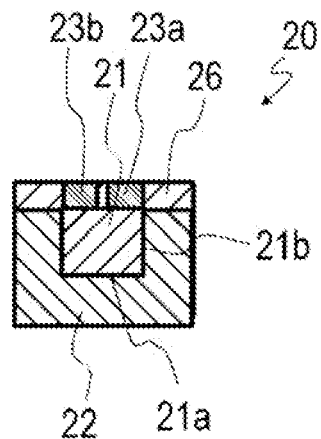
FIG. 21 is a schematic cross-sectional view of another example of a light source in the light-emitting module according to the embodiment.

The light-transmissive member 22 in the light source 20 can cover the upper surface 21a and the lateral surfaces 21b of the light-emitting element 21 as shown in FIG. 21.

The light-transmissive member 22 can contain a wavelength conversion member. The wavelength conversion member contains a phosphor that can absorb light emitted from the light-emitting element 21 to emit light with another wavelength. Accordingly, the light-emitting module 100 can emit light with a mixed color, such as white light, resulting in combination of light emitted from the light-emitting element 21 and light being subjected to wavelength conversion by the wavelength conversion member, to the outside. The color of the emitted light can be appropriately adjusted by selecting the type of the light-emitting element 21 and the type of the phosphor. The phosphor is excited by light emitted from the light-emitting element 21 and emits light with a wavelength different from the wavelength of the light emitted from the light-emitting element 21. For example, a YAG phosphor, a β-SiAlON phosphor, a fluoride phosphor such as a KSF phosphor and an MGF phosphor, or a nitride phosphor such as a CASN phosphor can be used as the phosphor. The light-transmissive member 22 can contain a plurality of types of phosphors. A plurality of layers containing the phosphors can be layered.

A wavelength conversion sheet can be disposed on the upper or lower surface of the light-emitting module 100. The wavelength conversion sheet is typically a resin sheet in which phosphor particles are dispersed. Use of such a wavelength conversion sheet allows the phosphor to be uniformly disposed on the upper or lower surface of the light-emitting module 100. In such a structure, the light-transmissive member 22 is not required to contain a phosphor or the like.

What is claimed is:

1. A light emitting module comprising:
    a board;
    a plurality of light sources arranged on a main surface of the board along a first direction and a second direction different from the first direction, each of the light sources including a first electrode and a second electrode exposed from an upper side of a corresponding one of the light sources;
    a first wiring including a plurality of first extending portions each extending from the first electrode of a corresponding one of the light sources and extending at least partially in the second direction, and a plurality of first connecting portions each extending in the first direction and electrically connecting two or more of the first extending portions;

a second wiring including a plurality of second extending portions each extending from the second electrode of a corresponding one of the light sources and extending at least partially in the first direction, and a plurality of second connecting portions each extending in the second direction and electrically connecting two or more of the second extending portions;

an insulating member covering the first extending portions and the first connecting portions of the first wiring and the second extending portions of the second wiring, the insulating member defining a plurality of openings so that a portion of each of the second extending portions of the second wiring is exposed from the insulating member through a corresponding one of the openings, wherein the second connecting portions of the second wiring are arranged on or above a part of the insulating member positioned on or above the first connecting portions of the first wiring, and the second connecting portions of the second wiring are respectively connected to the second extending portions at the openings.

2. The light emitting module according to claim 1, wherein each of the first extending portions includes a first portion extending along a prescribed direction, and a second portion extending along a different direction from the prescribed direction.

3. The light emitting module according to claim 2, wherein a length of the first portion in the prescribed direction is greater than a width of the first portion in a direction perpendicular to the prescribed direction in a top view.

4. The light emitting module according to claim 1, wherein each of the second extending portions includes a third portion extending along a prescribed direction, and a fourth portion extending along a different direction from the prescribed direction.

5. The light emitting module according to claim 4, wherein a length of the third portion in the prescribed direction is greater than a width of the third portion in a direction perpendicular to the prescribed direction in a top view.

6. The light emitting module according to claim 1, wherein in a top view, each of the light sources has a quadrangular shape, each of the first electrode and the second electrode of each of the light sources is triangular, and the first electrode and the second electrode are located diagonally opposite to each other on the upper side of each of the light sources.

7. The light emitting module according to claim 1, wherein the first extending portions and the first connecting portions are constituted by the same metal layer.

8. The light emitting module according to claim 1, further comprising a covering layer disposed on the board and covering around the light sources.

* * * * *